US005699234A

United States Patent [19]

Saia et al.

[11] Patent Number: 5,699,234

[45] Date of Patent: Dec. 16, 1997

[54] STACKING OF THREE DIMENSIONAL HIGH DENSITY INTERCONNECT MODULES WITH METAL EDGE CONTACTS

[75] Inventors: Richard Joseph Saia, Schenectady; Bernard Gorowitz, Clifton Park; Kevin Matthew Durocher, Waterford, all of N.Y.

[73] Assignee: General Electric Company, Schenectady, N.Y.

[21] Appl. No.: 790,045

[22] Filed: Jan. 28, 1997

Related U.S. Application Data

[62] Division of Ser. No. 453,109, May 30, 1995.

[51] Int. Cl.[6] .......... H01R 23/70; H01L 23/055

[52] U.S. Cl. .......... 361/790; 257/686; 361/761; 361/764; 361/803

[58] Field of Search .......... 174/52.1, 52.4; 257/685, 686, 700, 777, 684; 361/735, 761, 762, 763, 764, 772, 774, 777, 790, 803, 744; 437/180, 183, 209, 915; 439/68, 69, 66, 91

[56] References Cited

U.S. PATENT DOCUMENTS

| | | | |
|---|---|---|---|
| 5,241,456 | 8/1993 | Marcinkiewicz et al. | 361/744 |
| 5,281,852 | 1/1994 | Normington | 437/209 |
| 5,324,687 | 6/1994 | Wojnarowski | 437/209 |
| 5,353,498 | 10/1994 | Fillion et al. | 437/209 |
| 5,466,634 | 11/1995 | Beilstein, Jr. et al. | 437/209 |
| 5,517,754 | 5/1996 | Beilstein, Jr. et al. | 437/209 |
| 5,563,086 | 10/1996 | Bertin et al. | 437/209 |
| 5,567,654 | 10/1996 | Beilstein, Jr. et al. | 437/209 |
| 5,571,754 | 11/1996 | Bertin et al. | 437/209 |

*Primary Examiner*—Donald Sparks

*Attorney, Agent, or Firm*—Ann M. Agosti; Marvin Snyder

[57] ABSTRACT

A method for fabricating a stack of circuit modules includes providing a plurality of substrates having module interconnection layers. Each of the substrates has a circuit chip with chip pads positioned therein and an electrically conductive feed-through line extending from a first surface of the substrate to a second surface of the substrate with the first surface being perpendicular to the second surface. Each of the module interconnection layers is situated over a respective first surface of each of the substrates and includes a module dielectric layer having module vias therein and a module pattern of electrical conductors extending through the module vias to couple the selected chip pads to the feed-through line. The plurality of substrates are stacked. A side interconnection layer is applied over a side surface including the second surfaces of the substrates. The side interconnection layer includes a side dielectric layer having side vias therein aligned with predetermined ones of the feed-through lines and a side pattern of electrical conductors extending through the side vias.

4 Claims, 4 Drawing Sheets

STACKING OF THREE DIMENSIONAL HIGH DENSITY INTERCONNECT MODULES WITH METAL EDGE CONTACTS

This application is a division of application Ser. No. 08/453,109, filed May 30, 1995 now U.S. Pat. No. 5,657, 537.

The invention was made with Government support under contract number F29601-89-C-0014 awarded by the Air Force. The Government has certain rights in the invention.

BACKGROUND OF THE INVENTION

This invention is generally related to a method for interconnecting integrated circuits with high volumetric efficiency and, more particularly, to a method of applying edge metallization on a substrate for use in a three-dimensional module.

A method of selectively interconnecting the edge contact areas of a plurality of tightly stacked substrates having integrated circuit patterns thereon is described in Eichelberger et al., U.S. Pat. No. 5,019,946, issued May 28, 1991, wherein I/O (input/output) metal fingers (metallization exposed to areas outside the integrated circuit) were extended over the edges of the substrate. Extending titanium/aluminum I/O metal fingers over the substrate edges during I/O metal patterning prior to circuit fabrication is difficult because these are sputter-deposited films and thickness conformality over an edge is about forty percent. Even if it were possible to reliably use titanium and aluminum, it would be difficult to protect the metal during subsequent processing because the I/O metal on the substrate edge, unlike the I/O metal on the top, is exposed. As a result, aluminum and titanium would be exposed to all wet chemical treatments normally encountered during circuit fabrication. These metals are not compatible with many chemicals and would be etched away.

A method for extending an electrical conductor over an edge of an HDI substrate is described in Gorczyca et al., U.S. Pat. No. 5,285,571, issued Feb. 15, 1994. In Gorczyca et al., "an edge metal last" process is used in which the I/O metal fingers of a two dimensional (2D) high density interconnect (HDI) module are extended over the edge of a substrate at the end of circuit fabrication. The module includes a first dielectric layer covering one or more electrical conductors on a substrate. The first dielectric layer is ablated to expose a portion of at least one electrical conductor and a second dielectric layer is then applied over the first dielectric layer and the exposed portion of the electrical conductor except for an extremity of the conductor. A second electrical conductor is subsequently applied and patterned to cover a portion of the second dielectric layer, the extremity of the conductor, and at least a portion of one edge of the substrate.

The fabrication sequence in Gorczyca et al. requires many processing steps. Furthermore, patterning of edge fingers (whether prior to 2D module fabrication or after 2D module fabrication) requires a conformal electrophoretic resist coating which is substantially free of defects. Laser patterning of such edges requires a precision placement of 45 degree angled mirrors on the laser stage because mirror misplacement can create laser focus problems. Moreover, the patterned edge fingers are difficult to protect during fixturing of the stack.

When the edge fingers are applied after 2D module fabrication, an air gap is formed between adjacent modules and creates a non-planar stack edge with alignment problems that can hinder the fabrication of stacks with more than four layers.

SUMMARY OF THE INVENTION

Accordingly, it would be advantageous to have a method for interconnecting 2D modules in a 3D stack which is more robust, less expensive, and requires less process steps than conventional techniques.

In the present invention, two-dimensional (2D) HDI layers of a stack are fabricated on substrates having electrically conductive feed-through lines which route the I/O fingers from the top surface of a substrate to an edge region of the substrate. After 2D module fabrication, the substrates can be cut to size, aligned, and stacked. The edge of the multilayer stack is planarized by a process such as grinding. The modules are then interconnected with a side HDI overlay process of applying a dielectric layer, forming vias to the feed-through lines, and applying a pattern of electrical conductors.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
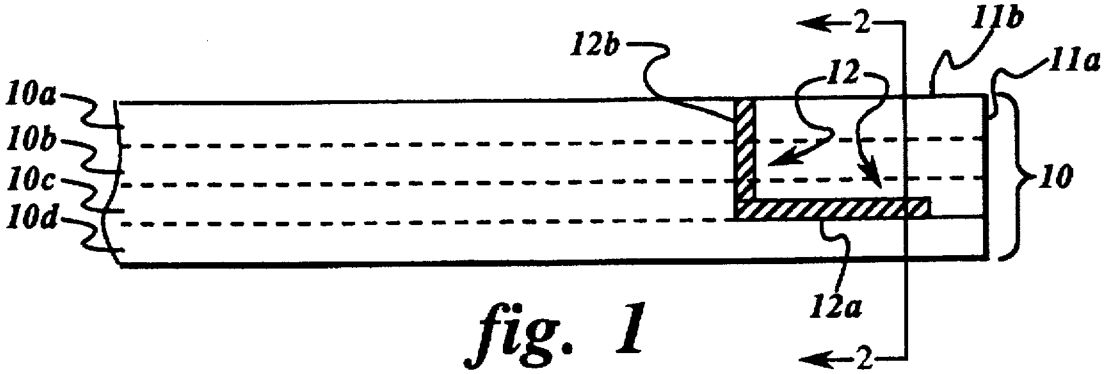
FIG. 1 is a sectional side view of a substrate having an electrically conductive feed-through line.
Figure 2:
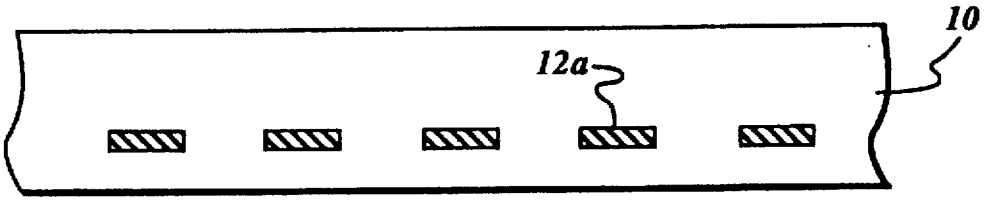
FIG. 2 is a sectional front view of the substrate shown in FIG. 1.

FIG. 1 is a sectional side view of a substrate 10 having an electrically conductive feed-through line 12, and FIG. 2 is a sectional front view of the substrate shown in FIG. 1. A substrate 10 may comprise any appropriate structural material, but preferably comprises a co-fired ceramic, pressed ceramic, glass ceramic, sapphire, diamond, fused silica, or molded plastic. Feed-through lines 12 extend through desired portions of substrate 10. Various options are available for fabrication of the substrate and feed-through lines, as discussed below.

In one embodiment, substrate 10 is a co-fired ceramic, such as beryllium oxide, alumina, or aluminum nitride, and a conventional multi-layer ceramic fabrication process is employed wherein the finished substrate 10 starts off as a distinct laminated structure of ceramic tape layers 10*a*, 10*b*, 10*c*, and 10*d*, for example. Ceramic tape layers are typically stacked in groups of two to fifty and generally comprise plasticizers and binders. Upon the co-firing of the ceramic tapes in a sintering oven that employs a controlled atmosphere and temperature, the plastic burns off and the layers sinter together to produce a monolithic structure.

In such an embodiment, a first portion 12*a* of feed-through line 12 can be applied between selected ceramic tapes before sintering. The first portion of the feed-through line comprises an electrically conductive material which can handle high temperatures. One such material is tungsten.

First portion 12*a* can either be surrounded by the substrate (as shown) or extend to a surface 11*a* of the substrate. If the first portion extends to the substrate surface, the feed-through line can be tested for electrical continuity, but the first portion will require protection from chemicals used during module fabrication.

A corresponding second portion 12*b* of a respective feed-through line 12 extends to a surface 11*b* (which is perpendicular to surface 11*a*) and can also be inserted before co-firing. In such an embodiment, second portion 12*b* may comprise an electrically conductive material which can withstand high temperatures, such as tungsten. In the process for inserting the second portions prior to co-firing, openings are drilled in the ceramic tape layers followed by the insertion of the second portions 12*b* of the feed-through lines. Preferably second portions 12*b* are first coated with a conductive paste such as tungsten paste to hold them in position during sintering. In the process for inserting the second portions after co-firing, openings are drilled and a sleeve of polymer dielectric material is used to position the second portions in the openings.

In one embodiment, the substrate has a height of about 60 mils, the first portions of feed-through lines have a cross-section of about 1 mil by 8 mils, and the second portions have diameters of 4 mils. These packages are commercially available from ceramics manufacturers which have used buried metal lines for two-dimensional interconnect purposes.

For substrates other than co-fired ceramics, the feed-through lines can be inserted in any appropriate manner. If a molded plastic substrate is used, for example, the feed-through lines could be held in predetermined positions while the molding occurs. If molding or substrate layering is not used, cavities for the feed-through lines can be drilled in the substrate material. Furthermore, if high temperature fabrication processes are not needed because co-firing does not occur, the material of the feed-though lines can include a wider variety of electrically conductive material, such as for example, Kovar, copper, and stainless steel.

Figure 3:
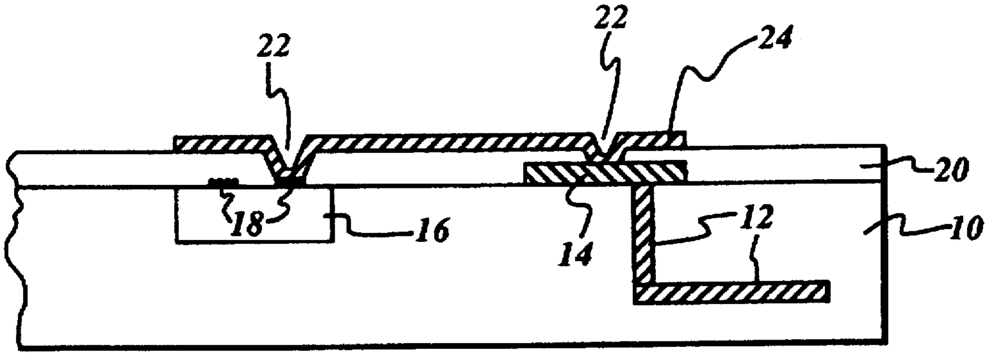
FIG. 3 is a view similar to that of FIG. 1 after the connection of a chip pad to the feed-through line through a base metallization layer.

FIG. 3 is a view similar to that of FIG. 1 after the connection of a chip pad 18 to feed-through line 12 through a base metallization layer 14. Base metallization layer 14 can be applied and patterned over substrate 10 using conventional techniques either prior to or after ceramic sintering. In an embodiment wherein the base metallization layer is applied after sintering, the base metallization layer may comprise electrically conductive material such as an adhesion promoting layer of titanium having a thickness of about 1000 Å covered by a layer of aluminum having a thickness of about 4 microns. If the base metallization layer is applied prior to sintering, it must be capable of handling sintering temperatures.

In addition to sewing as a stable contact pad for output interconnection purposes, base metallization 14 can be patterned to provide one or more paths for electrical signals within the module. Preferably the base metallization is applied and patterned prior to the positioning of chips in the substrate.

The substrate has chip wells with depths equaling the approximate thickness of corresponding chips 16. Chip wells may be fabricated by any conventional method, including mechanical machining after substrate 10 is co-fired and punching out selected areas in a top ceramic tape layer 10*a* prior to co-firing the substrate. One or more chips can be placed in each chip well. In one embodiment chips 16 are attached to substrate 10 with an adhesive layer (not shown). A chip may comprise any electrical circuit component, including semiconductor chips, such as integrated circuits (ICs), and discrete devices, such as, for example, capacitors, resistors, inductors, and transducers.

A dielectric layer 20 and pattern of electrical conductors 24 can be applied using a conventional HDI overlay method. A dielectric layer comprising a material such as Kapton polyimide (Kapton is a trademark of E. I. dupont de Nemours and Co.) can be laminated to the substrate and chip with an adhesive. A method of performing the basic HDI overlay process is described in Eichelberger et al., U.S. Pat. No. 4,783,695, issued Nov. 8, 1988, and a method for lamination is described in Eichelberger et al., U.S. Pat. No. 4,933,042, issued Jun. 12, 1990. Following the lamination step, vias 22 aligned with chip pads 18 and base metallization layer 14 are formed through the dielectric layer. One method of forming vias is by a laser dither step as is described in aforementioned Eichelberger et al., U.S. Pat. No. 4,894,115, and an adaptive lithography system is described for providing high density interconnect in Eichelberger et al., U.S. Pat. No. 4,835,704, issued May 30, 1989. In another embodiment of the invention, dielectric layer 20 can be fabricated by using a spin or spay coated photosensitive polyimide that can be patterned a with mask exposure technique or by direct laser ablation in the basic HDI process discussed above. Appropriate materials for laser ablation can be polymers such as fully imidized polyimides, polyetherimides, benzocyclobutene, Teflon polytetrafluoroethylene (Teflon is a trademark of E. I. dupont de Nemours & Co.), polymethylmethacrylate, or others which can absorb the laser energy sufficiently to be ablated without damage to the underlying chip pads, are thermally stable at 150° C., and are compatible with subsequent application and test patterning of the electrical conductors.

The pattern of electrical conductors 24 can be fabricated by sputtering metal which can be titanium, chromium, molybdenum, or any other metal that will act as a barrier metal to the subsequent metal deposition. In some cases only one metal type may need to be applied by sputtering or plating steps. To build metal thickness above a few microns, if necessary, electroplating of a metal such as copper can be performed. In one embodiment, a suggested combination of metallization is sputtering of 0.1 μm titanium followed by 0.3 μm copper, electroplating 4 μm copper and capping by sputtering 0.1 μm titanium. The pattern of electrical conductors can be patterned using conventional photoresist techniques.

Figure 4:
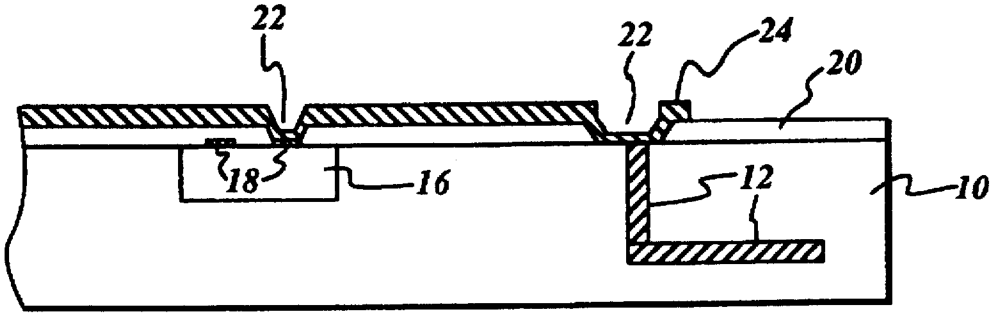
FIG. 4 is a sectional side view similar to that of FIG. 3 without the base metallization layer.

FIG. 4 is a sectional side view similar to that of FIG. 3 without base metallization layer 14. In this embodiment, one of the vias 22 is aligned with feed-through line 12, and the pattern of electrical conductors 24 is in direct contact with the feed-through line.

Figure 5:
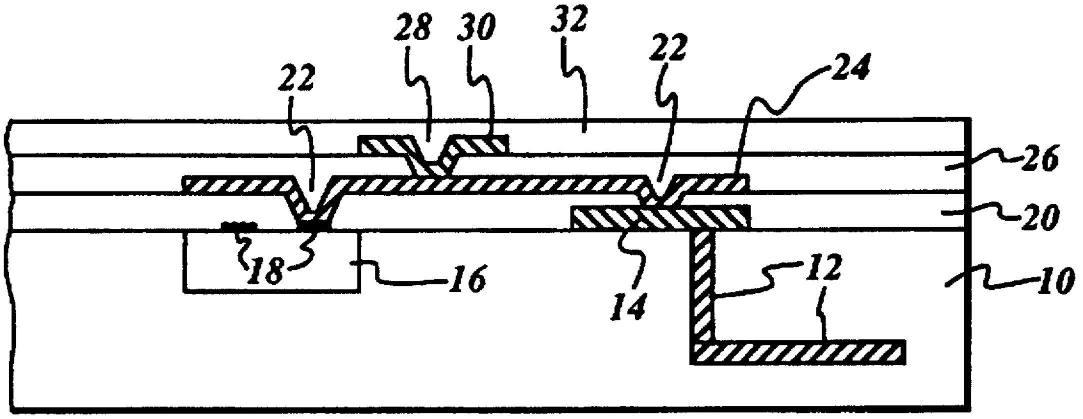
FIG. 5 is a view similar to that of FIG. 3 and further showing the addition of another layer of electrical connection.

FIG. 5 is a view similar to that of FIG. 3 and further showing the addition of a second dielectric layer 26 and another pattern of electrical conductors 30. Although for many applications the invention needs only one layer of interconnect, more levels may be added if desired. Second dielectric layer 26 may comprise a material similar to that of dielectric layer 20. In one embodiment, the second dielectric layer is applied using the SPI (silicon polyimide)/epoxy-Kapton polyimide multi-lamination process described in Gorczyca et al., U.S. Pat. No. 5,161,093, issued Nov. 3, 1992. Other lamination methods are described in aforementioned Eichelberger et al, U.S. Pat. No. 4,783,695, and aforementioned Eichelberger et al., U.S. Pat. No. 4,933,042. After the second level of dielectric is applied, vias 28 can be formed and a second pattern of electrical conductors 30 can be applied as discussed above. In one embodiment, a passivation layer 32 is applied over the module. The passivation layer preferably comprises a dielectric material such as applied using the SPI (silicon polyimide)/epoxy-Kapton polyimide multi-lamination process described in aforementioned Gorczyca et al., U.S. Pat. No. 5,161,093.

Figure 6:
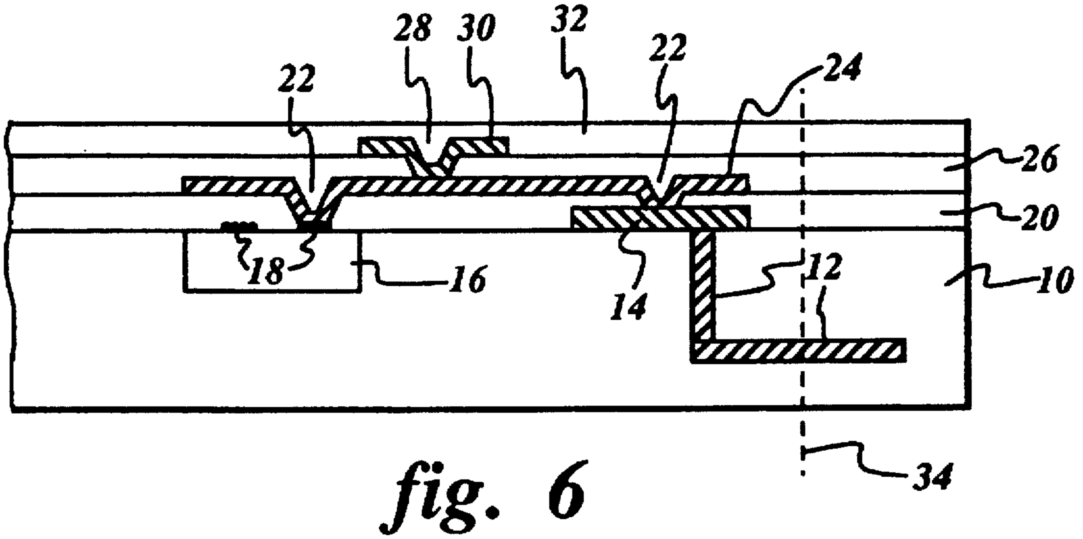
FIG. 6 is a view similar to that of FIG. 5 further showing a location where a cut can be made.

FIG. 6 is a view similar to that of FIG. 5 further showing a location 34 where a cut can be made. In a preferred embodiment, as shown, feed-through line 12 does not extend all the way to the surface of substrate 10 during chip interconnection and an act of cutting or grinding is later used to expose the lead. As stated above, if the feed-through line does extend to the substrate surface it must be protected during chip interconnection. The cutting can be performed either before or after stacking. The combination of the dielectric layers and patterns of electrical conductors will be referred to as a respective HDI module interconnect layer 36 for simplicity in further describing the invention.

Figure 7:
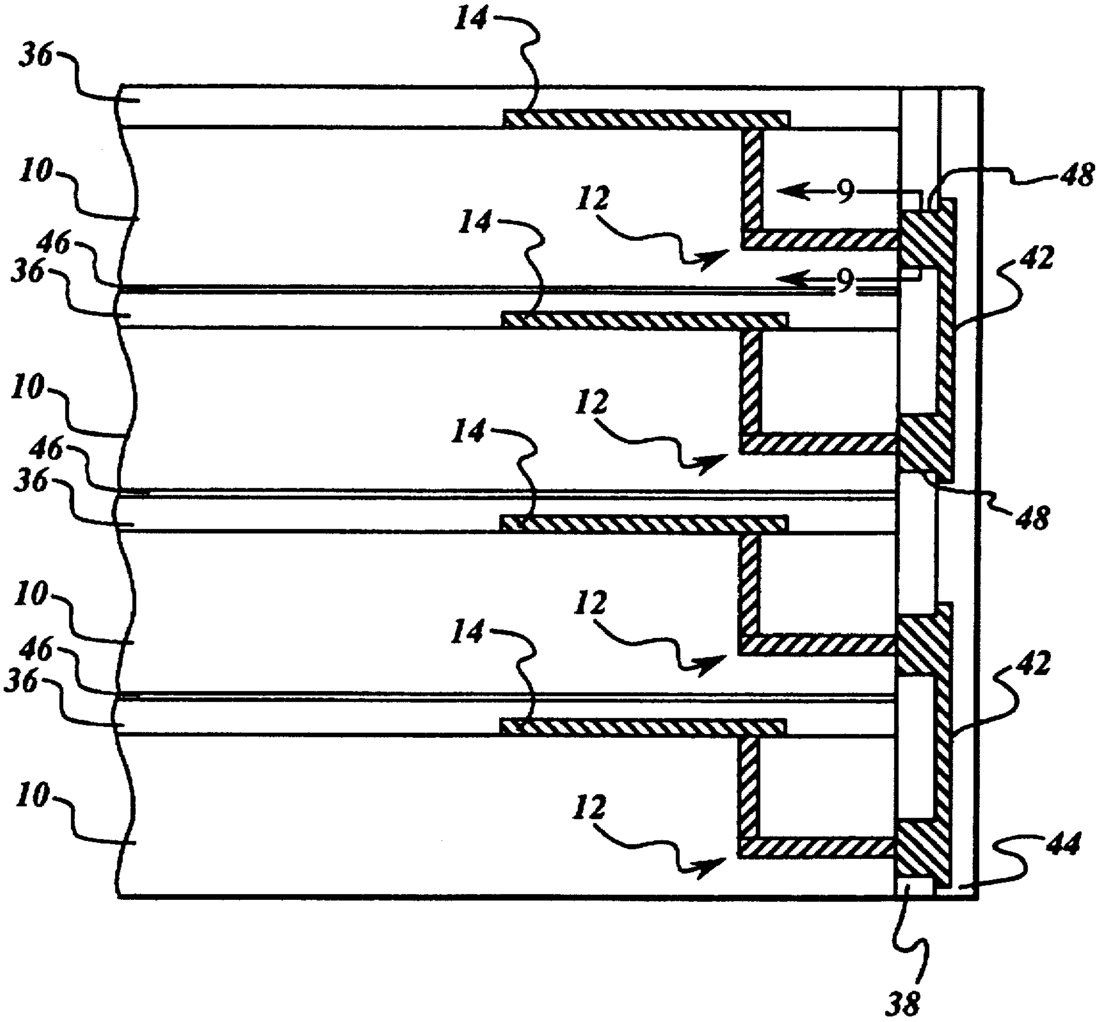
FIG. 7 is a sectional side view of a plurality of stacked and interconnected modules.

FIG. 7 is a sectional side view of a plurality of stacked and interconnected modules (for simplicity of illustration, chips 16 are not shown). After 2D module fabrication, substrates 10 and module interconnect layers 36 are cut to size, aligned, and glued together with an adhesive 46 such as Siltem/Benzoflex thermoplastic adhesive (Siltem is a trademark of General Electric Company, and Benzoflex is a trademark of Velsicol Chemical Corporation). The adhesive is preferably a film that is cut to the same size as the substrates and allowed to flow past the substrate edges during heating to completely fill any gaps between the substrates.

A side edge of the multilayer stack is then planarized by a technique such as grinding which removes any excess adhesive (and exposes the edge vias, if they were not already exposed by substrate fabrication or cutting processes). This type of planarization step is not feasible with "wrap-around" edge type processes because the fingers would be removed. Multiple edges (or every edge) of the stack can have feed-through vias extending therethrough.

Figure 9:
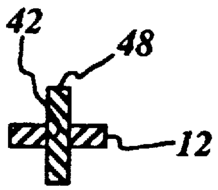
FIG. 9 is a sectional view along line 9—9 of FIG. 7.

The planarized stack is positioned in a holder (not shown) to protect the stack from wet chemicals preferably with a side edge having feed-through vias facing upward. In one embodiment, the holder comprises titanium. A side dielectric layer 38 is laminated using a pressure lamination process in a similar manner as discussed with respect to FIG. 3. Rectangular oversized vias 48 are drilled through the side dielectric layer down to the rectangular feed-through lines 12 on the planarized ceramic substrate edge. The drilled vias can form a cross with the feed-through lines to provide a margin of alignment tolerance, as shown in FIG. 9.

The modules can then be interconnected by depositing and patterning a pattern of electrical conductors 42 in a similar manner as discussed with respect to FIG. 3. In one embodiment a scaled turn point polygon adaptive lithography technique can be used, as described in commonly assigned Douglas et al., "Scaled Turn Point Polygon Adaptive Lithography," U.S. application Ser. No. 08/453,110, filed concurrently herewith and herein incorporated by reference, for precise alignment of vias 48 and pattern of electrical conductors 42 by introducing a scale factor in addition to the translational and rotational factors described in aforementioned Eichelberger et al., U.S. Pat. No. 4,835,704. The stack can be passivated with an additional dielectric layer 44.

The resulting planar stack is free of topography induced lamination voids. Because of the ability to grind the stack edge flat, layer to layer alignment is not critical, thus permitting the fabrication of 3D stacks with a large number of layers.

Figure 8:
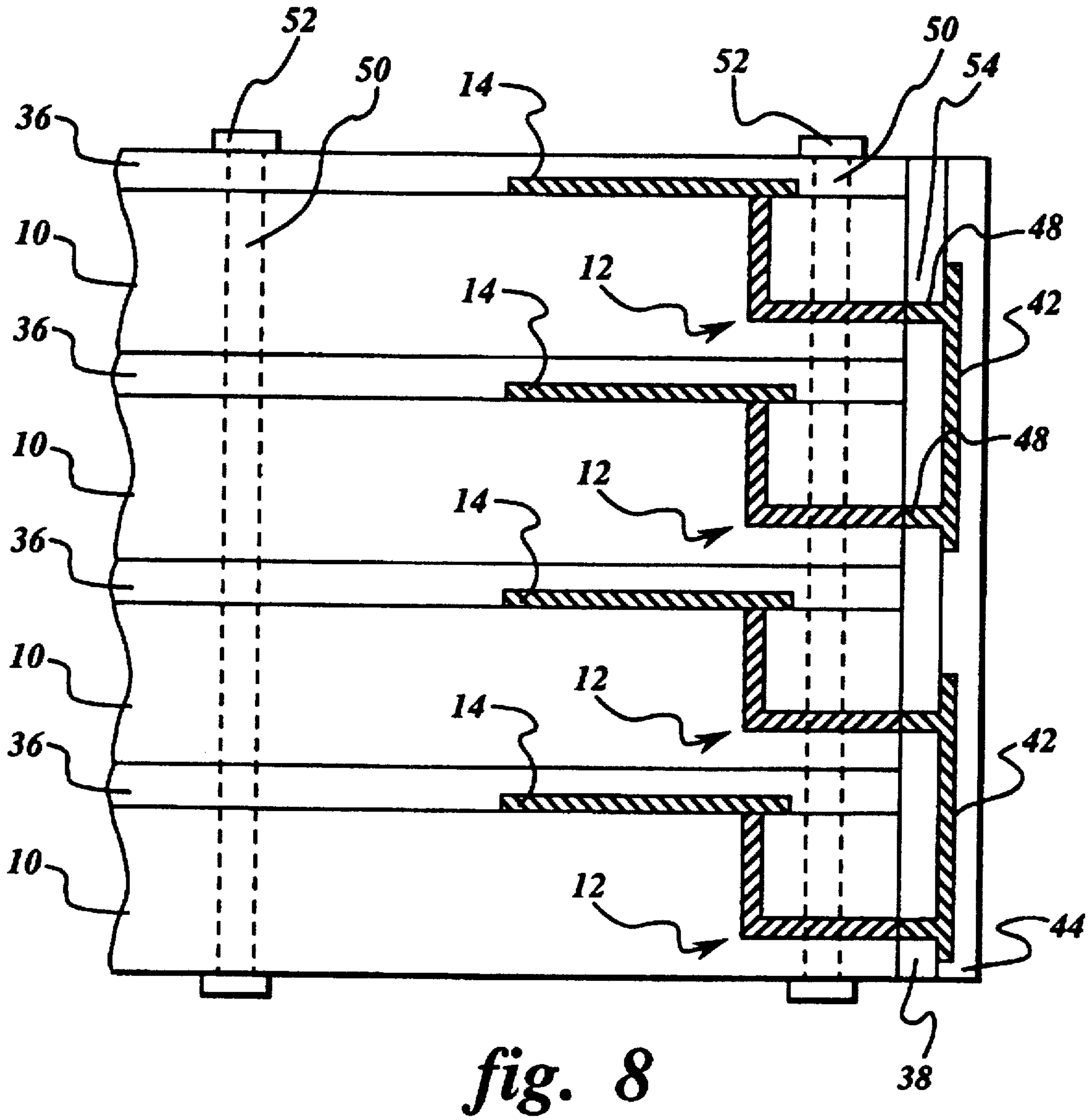
FIG. 8 is a sectional side view of another embodiment of a plurality of stacked and interconnected modules.

FIG. 8 is a sectional side view of another embodiment of a plurality of stacked and interconnected modules. In this embodiment rods 50 with bolts 52 are used to hold the stack together instead of adhesive bonding. Holes can be drilled through the modules either before or after stacking for insertion of the rods.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A stack of two dimensional circuit modules, comprising:

a plurality of substrates in stacked configuration, each of the substrates having a circuit chip with chip pads positioned therein and each of the substrates having an electrically conductive feed-through line extending from a first surface of the substrate to a second surface of the substrate, the first surface being perpendicular to the second surface;

a module interconnection layer over a respective first surface of each of the substrates, the interconnection layer comprising a module dielectric layer having module vias therein aligned with at least one of the chip pads and the feed-through line and a module pattern of electrical conductors extending through the module vias;

a side interconnection layer over the second surfaces of the substrates, the side interconnection layer comprising a side dielectric layer having side vias therein aligned with predetermined ones of the feed-through lines and a side pattern of electrical conductors extending through the side vias.

2. The stack of claim 1, further comprising a passivation layer over the side interconnection layer.

3. The stack of claim 1, wherein at least some of the substrates comprise ceramic material.

4. A stack of two dimensional circuit modules, comprising:

a plurality of substrates in stacked configuration, each of the substrates having a circuit chip with chip pads positioned therein and each of the substrates having an electrically conductive feed-through line extending from a first surface of the substrate to a second surface of the substrate, the first surface being perpendicular to the second surface;

a base metallization layer patterned over at least a portion of the first surface of each of the substrates, the base metallization layer being electrically coupled to the feed-through line;

a module interconnection layer over a respective base metallization layer and a respective first surface of each of the substrates, the interconnection layer comprising a module dielectric layer having module vias therein aligned with at least one of the chip pads and at least a portion of the base metallization layer, and a module pattern of electrical conductors extending through the module vias;

a side interconnection layer over the second surfaces of the substrates, the side interconnection layer comprising a side dielectric layer having side vias therein aligned with predetermined ones of the feed-through lines and a side pattern of electrical conductors extending through the side vias.

* * * * *